US012777265B2

(12) United States Patent
Simony

(10) Patent No.: US 12,777,265 B2
(45) Date of Patent: Oct. 27, 2026

(54) ELECTRONIC CIRCUIT FOR IMAGE SENSING

(71) Applicant: STMicroelectronics (Grenoble 2) SAS, Grenoble (FR)

(72) Inventor: Laurent Simony, Grenoble (FR)

(73) Assignee: STMicroelectronics International N.V., Geneva (CH)

( * ) Notice: Subject to any disclaimer, the term of this patent is extended or adjusted under 35 U.S.C. 154(b) by 127 days.

(21) Appl. No.: 18/616,454

(22) Filed: Mar. 26, 2024

(65) Prior Publication Data

US 2024/0334080 A1 Oct. 3, 2024

(30) Foreign Application Priority Data

Mar. 30, 2023 (FR) .................................. FR2303104

(51) Int. Cl.

| | |
|---|---|
| ***H04N 25/616*** | (2023.01) |
| ***H03F 3/45*** | (2006.01) |
| ***H04N 25/709*** | (2023.01) |
| ***H04N 25/77*** | (2023.01) |

(52) U.S. Cl.

CPC ....... *H04N 25/616* (2023.01); *H03F 3/45475* (2013.01); *H04N 25/709* (2023.01); *H04N 25/77* (2023.01); *H03F 2200/69* (2013.01)

(58) Field of Classification Search

CPC .... H04N 25/616; H04N 25/709; H04N 25/77; H04N 25/671; H04N 25/771; H04N 25/65; H04N 25/618; H04N 25/67; H03F 3/45475; H03F 2200/69

See application file for complete search history.

(56) References Cited

U.S. PATENT DOCUMENTS

| | | | | |
|---|---|---|---|---|
| 6,456,157 | B1 * | 9/2002 | Forbes | G05F 1/56 327/543 |
| 6,532,040 | B1 | 3/2003 | Kozlowski et al. | |
| 9,961,292 | B1 * | 5/2018 | Deng | H03F 1/0261 |
| 2017/0324385 | A1 | 11/2017 | McKay | |
| 2021/0195126 | A1 * | 6/2021 | Palmigiani | H04N 25/65 |
| 2021/0351223 | A1 * | 11/2021 | Nomoto | H04N 25/616 |
| 2022/0191423 | A1 * | 6/2022 | Bohannon | H04N 25/77 |

FOREIGN PATENT DOCUMENTS

CN 101815179 B * 6/2012 ............. H04N 25/65

OTHER PUBLICATIONS

Zhangqiang Ren, CMOS image sensor (Year: 2012).*
INPI Search Report and Written Opinion for priority application, FR Appl. No. 2303104, report dated Oct. 1, 2023, 9 pgs.

* cited by examiner

*Primary Examiner* — Twyler L Haskins
*Assistant Examiner* — Surafel Yilmakassaye
(74) *Attorney, Agent, or Firm* — Crowe & Dunlevy LLC

(57) ABSTRACT

An electronic circuit includes image acquisition cells, wherein each cell has a photodetector coupled to a first node of the cell, and an amplifying transistor having a gate connected to the first node, a conduction node coupled to an output of the cell, and a node for controlling a back gate voltage. The amplifying transistor is configured so that its threshold voltage varies according to the back gate voltage. A control circuit adjusts a voltage applied to the control node of the back gate voltage of the amplifying transistor of one of the cells according to a comparison of the voltage present at the cell output and a reference voltage.

16 Claims, 5 Drawing Sheets

ELECTRONIC CIRCUIT FOR IMAGE SENSING

PRIORITY CLAIM

This application claims the priority benefit of French Application for Patent No. 2303104, filed on Mar. 30, 2023, the content of which is hereby incorporated by reference in its entirety to the maximum extent allowable by law.

TECHNICAL FIELD

The present disclosure generally concerns electronic circuits and, in particular, image sensors.

BACKGROUND

The electronic circuits of image sensors comprise, in certain cases, image acquisition cells, called pixels, comprising a photodiode used in reverse. For certain types of pixels, the obtaining of the illumination level received by a pixel requires the measurement of the voltage across the photodiode, at selected times. During an acquisition period, the voltage across the photodiode varies under the effect of the integration of the current photogenerated in the capacitive element of the diode. The measurement of the voltage across the photodiode is performed after the pixel has been reset. This resetting induces random noise having a standard deviation equal to $$\sqrt{\frac{kT}{C}},$$

where k is Boltzmann's constant, T the temperature, and C the capacitance of the photodiode.

However, certain new prospective organic photosensitive materials for replacing the semiconductors conventionally used do not allow the use of a pinned diode, and different pixel architectures thus have to be used.

There is a renewed interest for image sensors comprising no transfer gate. These pixel architectures are, for example, of "3T"-type, with three transistors or also of capacitive transimpedance amplifier (CTIA) type. These pixel architectures are, however, subject to the noise induced by the resetting of the photodiode, which is generally greater by a factor ten than all other noise sources.

There exists a need to obtain electronic circuits comprising pixels where the impact of the $$\sqrt{\frac{kT}{C}}$$

noise is decreased.

There is a need to overcome all or part of the disadvantages of known electronic circuits.

SUMMARY

An embodiment provides an electronic circuit comprising image acquisition cells, wherein each cell comprises: a photodetector coupled to a first node of the cell; an amplifying transistor having: its gate connected to the first node, a conduction node coupled to an output of the cell, and a node for controlling a back gate voltage, the amplifying transistor being configured so that its threshold voltage varies according to the back gate voltage of the amplifying transistor; and at least one control circuit configured to adjust a voltage applied to the node for controlling the back gate voltage of the amplifying transistor of one of the cells according to a voltage present at the cell output and to a reference voltage.

An embodiment provides an electronic circuit control method, the method comprising: adjusting, by means of a control circuit, according to a voltage present at an output of an image acquisition cell and to a reference voltage, a voltage applied to a node for controlling a back gate voltage of an amplifying transistor of the image acquisition cell of the electronic circuit, said amplifying transistor being configured so that its threshold voltage varies according to said back gate voltage, each cell comprising: a photodetector coupled to a first node of the cell, and said amplifying transistor having a conduction node coupled to the output of the cell and having its gate connected to the first node.

In an embodiment, the amplifying transistor is formed in a technology using a depleted semiconductor substrate on insulator.

In an embodiment, each cell comprises a sampling capacitor and a sampling transistor, the node for controlling the back gate voltage of the amplifying transistor of each cell being coupled to the sampling capacitor and coupled to an output of the control circuit via the sampling transistor.

In an embodiment, the sampling capacitor stores a sampled correction value of the output of the control circuit on the node for controlling the back gate voltage of the amplifying transistor.

In an embodiment, the size of the sampling capacitor is independent from the sensitivity of the image acquisition cell.

In an embodiment, the control circuit comprises a differential amplifier having a first input coupled to said output of the cell, and having a second input configured to receive the reference voltage, an output of the differential amplifier delivering an output voltage, applied to the sampling transistor, and which is a function of a difference between the voltage present at the cell output and the reference voltage.

In an embodiment, the first node of each cell is a sense node and each cell comprises: a readout transistor series-connected with the amplifying transistor; and a reset transistor configured to couple the sense node to a reset voltage rail, the amplifying transistor being assembled as a source-follower device and having said conduction node coupled to the output of the cell via the readout transistor.

In an embodiment, each cell is of capacitive transimpedance amplifier type and comprises: a readout transistor series-connected with the amplifying transistor; a reset transistor configured to couple an integration node, common to the readout transistor, to the amplifying transistor, and to the reset transistor, to the first node; and an integration capacitive element coupling the integration node and the first node; the amplifying transistor having said conduction node coupled to the output of the cell via the readout transistor.

In an embodiment, at least some of the cells are arranged in at least one cell column, where the outputs of the cells are interconnected by at least one first column conductor coupled to a current source and to a first control circuit configured to sequentially adjust a voltage applied to the node for controlling the back gate voltage of the amplifying transistor of each of the column cells.

In an embodiment, the amplifying transistor is insulated by trenches.

In an embodiment, the sampling capacitor has a capacitance greater than that of the associated first node or of the capacitive element.

In an embodiment, the photodetectors comprise an organic material and/or nanoparticles.

BRIEF DESCRIPTION OF THE DRAWINGS

The foregoing features and advantages, as well as others, will be described in detail in the rest of the disclosure of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the steps and elements that are useful for the understanding of the described embodiments have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following description, when reference is made to terms qualifying absolute positions, such as terms "edge", "back", "top", "bottom", "left", "right", etc., or relative positions, such as terms "above", "under", "upper", "lower", etc., or to terms qualifying directions, such as terms "horizontal", "vertical", etc., it is referred, unless specified otherwise, to the orientation of the drawings.

Unless specified otherwise, the expressions "about", "approximately", "substantially", and "in the order of" signify plus or minus 10%, preferably of plus or minus 5%.

Figure 1A:
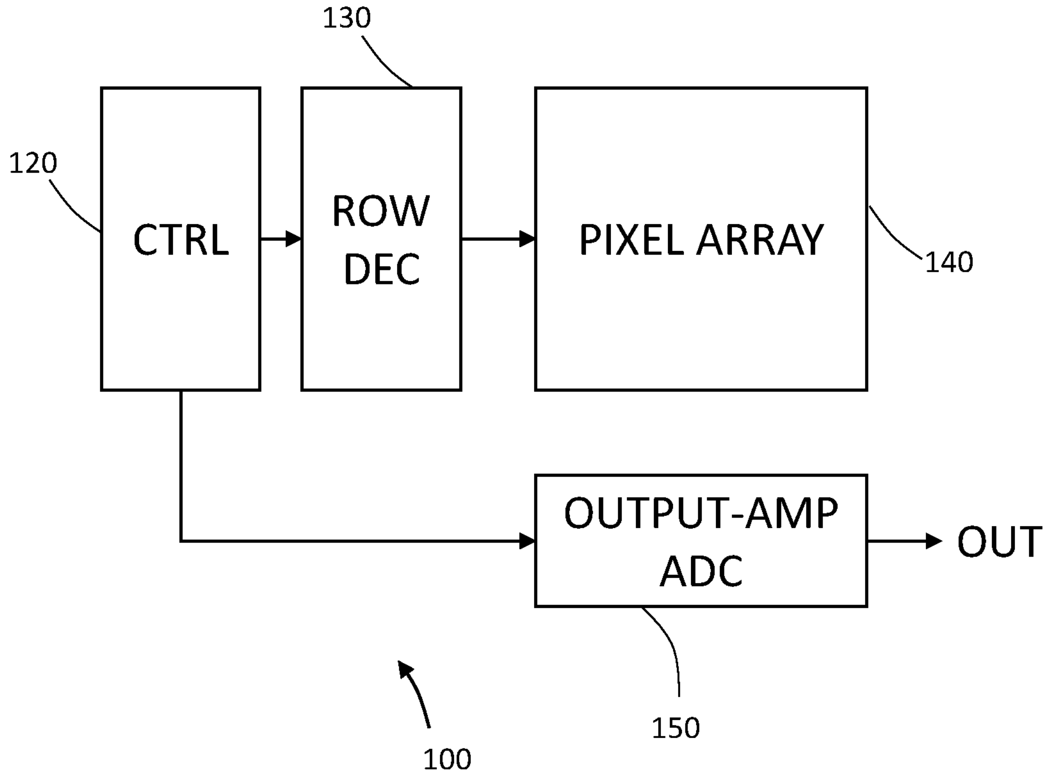
FIG. 1A is a block diagram of an example of electronic image acquisition circuit.

FIG. 1A is a block diagram of an example of an electronic image acquisition circuit 100. This circuit comprises an image acquisition array 140 (PIXEL ARRAY) comprising an array network of image acquisition cells or pixels at the intersection of row conductors and of column conductors. The acquisition device also comprises a control unit 120 (CTRL) driving, among others, a row decoding circuit 130 (ROW DEC) and a circuit 150 of output amplifiers (OUTPUT-AMP ADC) or of analog-to-digital converters, generally one per column, delivering digital signals OUT representative of the illumination of the different cells. These digital signals are processed by a device (not shown) associated with the electronic image acquisition circuit and comprising, for example, circuits for storing the values assigned to the different cells and of image processing.

Figure 1B:
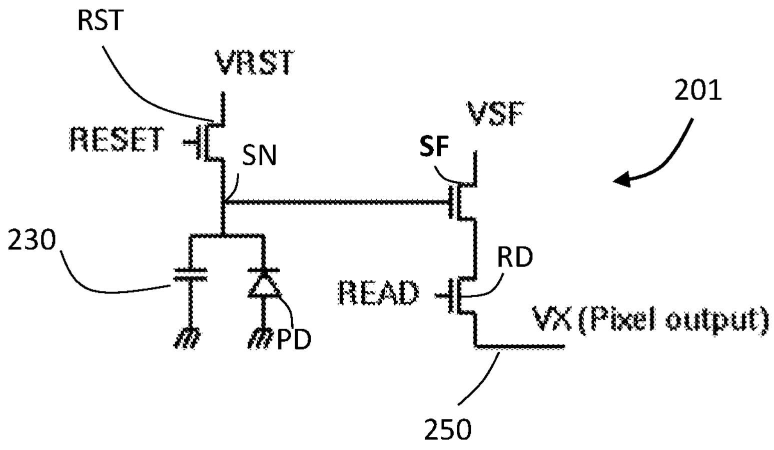
FIG. 1B is a simplified view of a "3T"-type pixel.

FIG. 1B is a simplified view of a pixel 201 of "3T" (signifying "3 transistors") type. Pixel 201 indeed comprises three transistors, a first transistor RST, a second transistor SF, and a third transistor RD.

In the example of FIG. 1B, pixel 201 comprises a photodiode PD referenced to ground and coupled to a sense node SN of pixel 201. The sum of all the capacitive elements connected to this sense node SN, that is, the junction capacitance of the photodiode, the capacitances of the connected transistors and the parasitic capacitances, is represented by reference 230. Photodiode PD is used in reverse and capacitive element 230 is, after a resetting, discharged by a photocurrent according to the received light intensity. The cathode of the photodiode is coupled to node SN.

In the example of FIG. 1B, first transistor RST is configured to couple sense node SN to a reset voltage rail, for example powered with a voltage VRST.

In the example of FIG. 1B, second transistor SF is assembled as a source-follower device, and has its gate connected to sense node SN and its source coupled to an output 250 of the pixel. The drain of second transistor SF is, for example, connected to a power supply rail of a positive potential VSF. In certain cases, voltages VRST and VSF are equal, although, in other examples, these voltages may be different from each other.

First transistor RST receives, on its gate, a signal RESET with two states for controlling the resetting of the voltage at sense node SN. When signal RESET is in a first state, first transistor RST is conductive. In a second state of signal RESET, transistor RST is off.

In the example of FIG. 1B, third transistor RD is series-connected with second transistor SF. In an example not illustrated, the drain of second transistor SF is coupled, by third transistor RD, to power supply voltage rail VSF. Third transistor RD is controlled by a row selection signal READ. Third transistor RD acts as a switch enabling to bias transistor SF for example by means of a column current source connected to the output 250 of pixel 201. When it is biased, transistor SF is a source-follower device which forwards the signal of node SN onto a node VX of the output 250 of pixel 201.

The switching from an on to an off state of the third transistor RD induces random noise having a standard deviation $$\sqrt{\frac{kT}{C}}$$

at node SN, which is forwarded by transistor SF to the output of pixel VX.

Figure 1C:
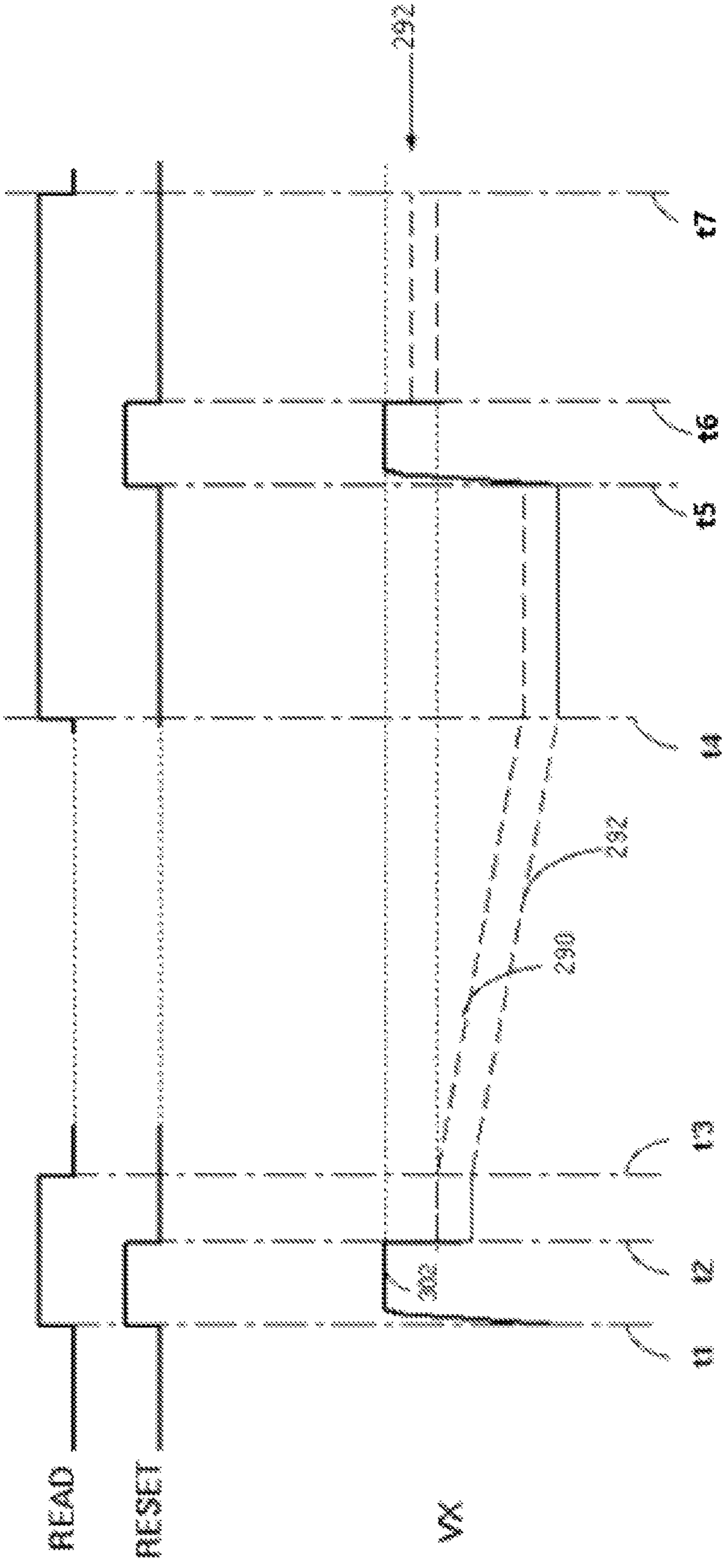
FIG. 1C is a timing diagram illustrating an example of operation of the circuit of FIG. 1B.

FIG. 1C is a timing diagram illustrating an example of operation of the circuit of FIG. 1B.

At a time t1, signals READ and RESET are set to a state, for example high, to turn on transistors RD and RST. Sense node SN is thus set to voltage VRST and voltage VX settles at a level 302 depending on an offset due to the sizing of transistor SF and to the value of the corresponding column current.

At a time t2, signal RESET is, for example, set to a low state to turn off transistor RST. The capacitance at sense node SN is in the order of one femtofarad, which results in that, at time t2, a $$\sqrt{\frac{kT}{C}}$$

wideband noise is generated in the channel of transistor RST, then sampled at sense node SN and ends up, in baseband, integrated to VX in the form of a random voltage offset, illustrated on curve 292, with respect to noise-free case 290. An integration phase starts from time t2, which causes the decrease (in the case where the charges are electrons) of voltage VX as charges are being photogenerated, until a time t5.

At a time t'3 between times t2 and t5, signal READ switches, for example, to a low state, to turn off transistor RD and to enable to access to other rows of the array.

At a time t4 between times t'3 and t5, signal READ switches, for example, to a high level to turn on transistor RD until a time t7. Between times t4 and t5, voltage VX is, for example, converted by an analog-to-digital converter not illustrated in FIG. 1C, which is coupled to the pixel output VX. In FIG. 1C, the time scales between times t1 and t'3 and between t4 and t7 are not the same as between t'3 and t4 so that the relatively long time between t'3 and t4 can be represented. Thereby, although the slopes of curves 290 and 292 between t'3 and t4 appear to be larger than between times t4 and t5, they are actually similar.

In the example of FIG. 1C, a phase of correlated double sampling takes place between time t6 and time t7 to know the value of VX in the absence of photogenerated charges. For this purpose, signal RESET switches to a high level at time t5 until a time t6 when it switches back to a low level. Between times t5 and t6, voltage VX settles again at the same level as between times t1 and t2, to within the $$\sqrt{\frac{kT}{C}}$$

random noise. At time t6 and until time t7, the pixel is read from with no signal, which corresponds to a first digitization of the level of voltage VX. The charges integrated between t6 and t7 may be neglected since the integration time is short. Between times t6 and t7, voltage VX is, for example, converted, during a second digitization, by the analog-to-digital converter used for the first integration phase and the comparison between the values obtained during the two digitizations gives access to the quantity of photogenerated charges. However, the $$\sqrt{\frac{kT}{C}}$$

random noise sampled on voltage SN when transistor RST switches from the high state to the low state is statistically different between the first and the second digitization. The standard deviation of the difference thus becomes $$\sqrt{\frac{2kT}{C}}$$

and this noise is predominating over all other noise sources, given the generally very low value of the capacitance C of sense node SN. It is thus desirable to provide a solution to decrease the impact of this noise.

Figure 2:
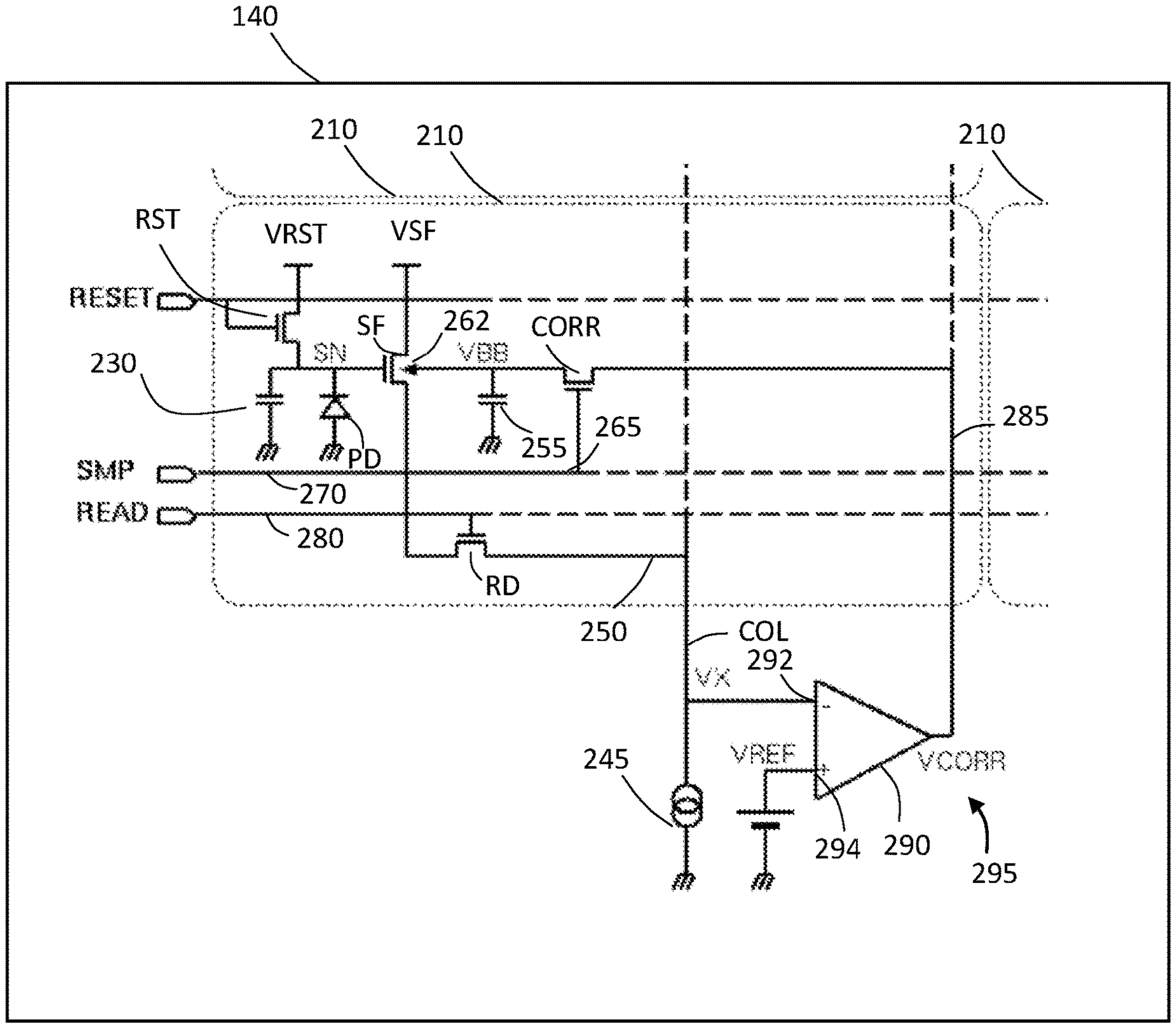
FIG. 2 is a simplified view of an array of image acquisition cells of an electronic circuit according to an embodiment of the present description.

FIG. 2 is a simplified view of an array 140 of image acquisition cells 210 of the electronic circuit according to an embodiment of the present disclosure. In the example of FIG. 2, a single cell 210 is shown for clarity. In an example, at least some of cells 210 are arranged in at least one cell column, where the cells are interconnected by at least one first column conductor COL coupled to a current source 245. In an example not illustrated, at least some of cells 210 are arranged in a plurality of cell columns and the cells of a same column are interconnected by at least one column conductor, for example insulated from the first column conductor, and coupled to another current source or to the same current source 245.

In the example of FIG. 2, each cell 210 comprises a "3T"-type pixel as described in FIG. 1B. Unlike FIG. 1B, in FIG. 2, the second transistor SF of each cell further comprises a node 262 of the transistor SF which is coupled for controlling a back gate voltage VBB of second transistor SF. Second transistor SF is, for example, configured so that its threshold voltage varies according to this back gate voltage applied to the transistor back gate.

Control node 262 corresponds, for example, to a "back" gate of second transistor SF. In this case, the gate connected to sense node SN is referred to as a "front" gate of second transistor SF. The back and front gates may act separately, and with a different associated transconductance, on a same channel of second transistor SF. The back gates may be formed, for example, by the technology using a depleted semiconductor substrate, preferably fully depleted, on insulator (Fully Depleted Silicon on Insulator, FDSOI). When the substrate of second transistor SF is of FDSOI type, the back gate is, for example, formed under a layer of insulator placed between the channel and the substrate. In this example, the front gate is, for example, formed at the surface above the insulator and the channel.

In another example, control node 262 corresponds to an electrode influencing the threshold voltage of the channel formed in the semiconductor material of the substrate of second transistor SF. For example, portions of the semiconductor material comprising said electrode are insulated from the rest of the substrate by insulating trenches, for example biased.

In the example of FIG. 2, the source of the second transistor SF of each cell of a same column is coupled, by third transistor RD, to the column conductor COL of array 140. Third transistor RD is controlled by a row selection signal READ, for example delivered on a control row 280 common to all the cells 210 of a same row. Transistor RD forwards the voltage information of node SN, which arrives on the output 250 of cell 210, to the column conductor COL of a same column with a value VX.

In the example of FIG. 2, the outputs 250 of the cells of a same column are, for example, interconnected by a same column conductor COL.

In the example of FIG. 2, the circuit comprises at least one first control circuit 295 having an input coupled to the output 250 of the cells 210 of a same column and having an output coupled to the control node 262 of the back gate voltage of the second transistor SF of the cells 210 of the same column via another column conductor 285 and via a sampling transistor CORR comprised in each pixel.

The control circuit 295 is, for example, configured to adjust a voltage VBB applied to the control node of the back gate voltage of the second transistor SF according to a control of the voltage VX present at the output 250 of the cell selected on signal READ so that it tends towards a reference voltage VREF.

In the example of FIG. 2, control circuit 295 comprises a differential amplifier 290, having a first input 292 coupled to said output 250 of the cell, and having a second input 294 configured to receive reference voltage VREF. Differential amplifier 290 has, for example, an output configured to deliver an output voltage VCORR, which is a function of the control level applied to voltage VX so that voltage VX tends towards reference voltage VREF. In an example, voltage VREF is selected to be at an average level of the voltages present at the storage nodes SN of the cells 210 of the column to which is subtracted the gate-source voltage of second transistor SF.

Control circuit 295 applies a correction voltage VCORR to the cell selected by transistor RD via the sampling transistor CORR of the same cell.

In the example of FIG. 2, each cell 210 comprises a storage capacitor 255 referenced to ground and sampling transistor CORR. The node 262 for controlling the back gate voltage of the second transistor SF of the cell is connected to storage capacitor 255 and connected to the output of differential amplifier 290 via sampling transistor CORR. One of the main conduction nodes of the sampling transistor CORR of each cell of a same column is coupled to the output of control circuit 295. In an example, storage capacitor 255 has a capacitance greater than the capacitance of sense node SN which enables, for example, to decrease the charge injection during the sampling by transistor CORR and to favor the retention of the control voltage VBB without having an impact on the conversion factor (in Volt/electron) of the pixel.

Sampling transistor CORR receives, on its gate, a signal SMP with two control states defining time ranges during which respectively 1) the output of amplifier 290 is coupled to the control node 262 of the back gate voltage of transistor SF, and 2) during which sampling transistor CORR is off and voltage VCORR is thus sampled and stored by capacitor 255. The retention of voltage VCORR is all the better as storage capacitive element 255 is connected on the back gate of transistor CORR, since the gain between the back gate and the source is approximately 10%, to be compared with approximately 90% for the front gate. The fact of having a significant capacitance thus limits the voltage drift due to leakage currents, and further, this voltage drift is strongly attenuated by the small gain between back gate 262 and the source of transistor SF. The control voltage VBB of node 262 corresponds to the output voltage VCORR of amplifier 290, sampled by sampling transistor CORR and stored by capacitive element 255.

The control value that can be observed in the voltage VBB sampled on capacitive element 255 also samples a $$\sqrt{\frac{kT}{C1}}$$

noise where "C1" here is the value of the sampling capacitance 255. However, sampling capacitance 255 being greater than the capacitance of sense node SN, the generated noise is lower. Further, the sampled voltage VBB being stored on back gate 262, its associated noise is multiplied by the amplification of the back gate (that is, approximately 10%), knowing that the main noise to be corrected of sense node SN is submitted to the amplification of approximately 90% of the front gate. By comparing these two contributions on node VX, the contribution to the total noise at output 250 introduced by the correction on back gate 262 is much lower than that of the noise to be corrected on sense node SN, for example by a ratio 1/10.

Signal SMP is, for example, common to all the cells of a same row and is delivered, for example, on a row line 270.

In operation, amplifier 290 delivers voltage VCORR to make the output voltage VX of the selected cell equal to reference voltage VREF.

Figure 3:
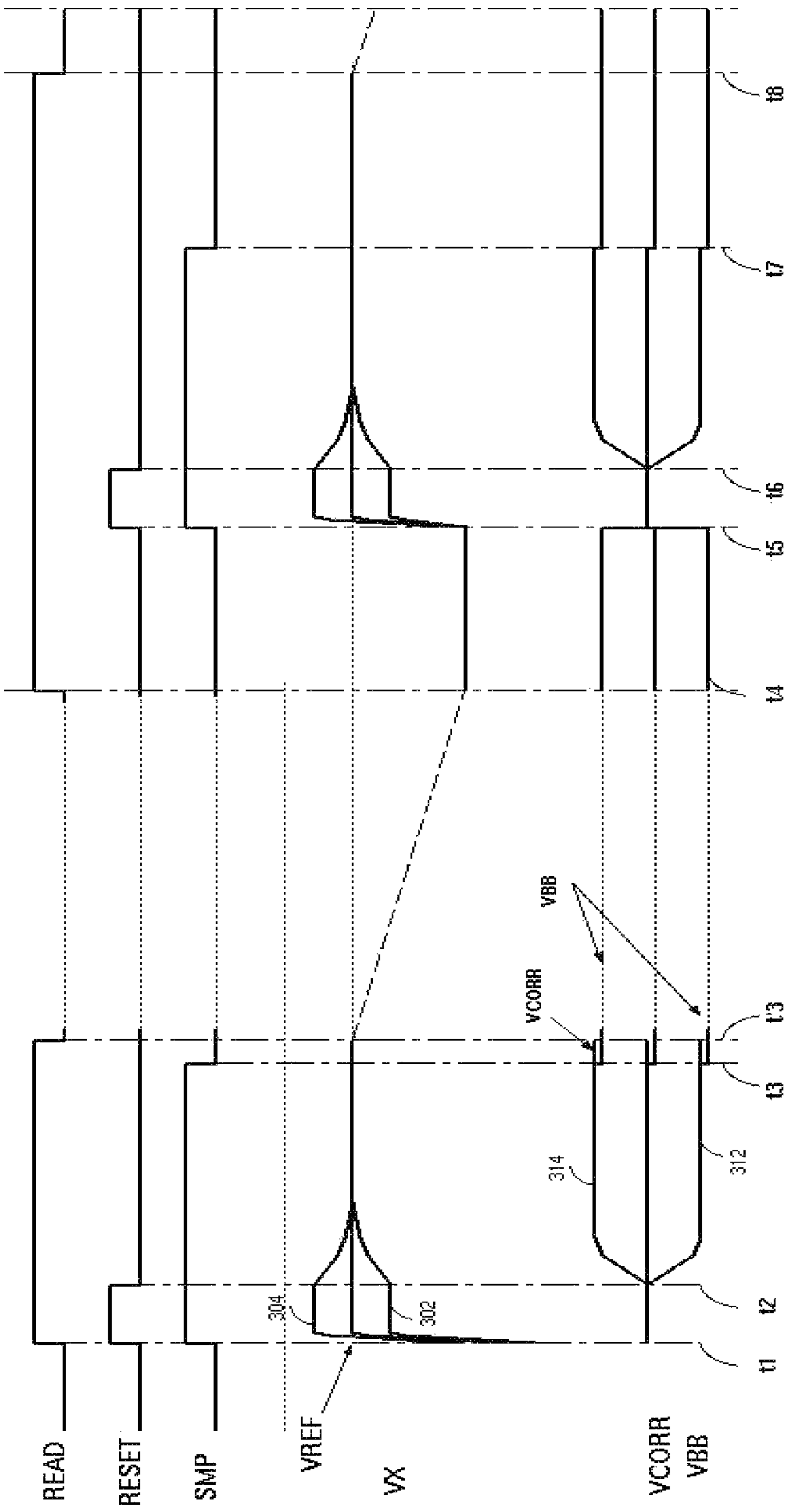
FIG. 3 is a timing diagram illustrating an operation of the circuit of FIG. 2.

FIG. 3 is a timing diagram illustrating an operation of the circuit of FIG. 2.

At a time t1, similar to the time t2 of FIG. 1C, signals READ, RESET, and SMP are set to a state, for example high, to turn on transistors RD, RST, and CORR. The cells 210 of the row to be read from are then selected. Sense node SN is thus set to voltage VRST and voltage VX settles at a level depending on an offset 302, 304 due to disparities in the sizing of transistor SF between cells.

At a time t2, signal RESET is, for example, set to a low state to turn off transistor RST. At time t2, the $$\sqrt{\frac{kT}{C}}$$

noise generated in the channel of transistor RST is sampled at the output of the pixel and ends up integrated to VX in the form of a voltage offset.

At a time t3, amplifier 290, which has, for example, been previously activated before time t2, delivers at its output the voltage VCORR generated based on a comparison between the initially noisy voltage VX and voltage VREF. The noise is sampled at time t2, which sets the amplifier input, which then needs a certain time (until t3) to settle. The level of the voltage VCORR thus obtained depends on the voltage on sense node SN comprising both the offsets due to the sizing differences of transistors SF and the $$\sqrt{\frac{kT}{C}}$$

noise. Voltage VCORR will modify the threshold voltage of the second transistor SF of the selected cell which, in turn, will modify the output voltage of cell VX by forming a control loop so that VX tends towards VREF.

At time t3, the amplifier output having settled at the correction value, signal SMP is set, for example, to a low level to turn off sampling transistor CORR and amplifier 290 is, for example, deactivated. The sampling capacitive element 255 of the correction then takes over by storing the control voltage for the entire duration of the integration which starts after the sampling.

As shown in the example of FIG. 3, at time t3, a charge injection may occur at control node 262, and result in a variation of voltage VCORR. There further exists another charge injection, much stronger, appearing at the time of the falling edge of signal RESET. Those skilled in the art will implement precautions to limit these charge injections and may, for this purpose, implement a correlated double sampling (CDS) method.

The output level VX obtained during the establishing and the sampling of the correction is mainly deterministic since the random portion corresponding to the $$\sqrt{\frac{kT}{C}}$$

noise has been corrected.

At time t'3, similar to the time t'3 of FIG. 1C, signal READ switches, for example to a low state, to turn off selection transistor RD.

Similarly to FIG. 1C, the first integration phase starts from time t2, which causes the decrease (in the case where the charges are electrons) of voltage VX as the charges are being photogenerated, until time t5 similar to FIG. 1C.

At time t4 between times t'3 and t5 and similar to the time t4 of FIG. 1C, signal READ switches, for example, to a high level to turn on transistor RD until time t8 similar to the time t8 of FIG. 1C. Between times t4 and t5, voltage VX is, for example, converted by an analog-to-digital converter, not illustrated in FIG. 3, which is coupled to output VX of the pixel.

In FIG. 3, the time scales between times t1 and t'3 and between t4 and t8 are not the same as between t'3 and t4 so that the relatively long time between t'3 and t4 can be represented. Thereby, although the slope of the curve of voltage VX between t'3 and t4 appears as stronger than between times t4 and t5, it is actually similar.

The electronic circuit and its operation, such as described in the example of FIGS. 2 and 3, enable to correct, while keeping a certain rapidity, by aligning the output voltage VX of the cell on reference voltage VREF, the random thermal noise intrinsic to "3T" assemblies. A similar problem may be applied to "CTIA" assemblies.

Similarly to FIG. 1C, the correlated double sampling phase takes place between times t7 and t8 to apply the reset value, before the integration phase, and taking into account the $$\sqrt{\frac{kT}{C}}$$

noise correction.

At time t5, after the conversion of the signal by means of the analog-to-digital converter, signals RESET and SMP switch back to a high level to respectively turn on transistors RST and CORR, and perform a new operation of control of noise $$\sqrt{\frac{kT}{C}}$$

by means of control circuit 295.

At time t6 similar to time t6 of FIG. 1C, signal RESET switches, for example, to a low level to turn off transistor RST. A new $$\sqrt{\frac{kT}{C}}$$

noise value is then sampled from the sense node.

Before time t6 or at t6, the amplifier is, for example, reactivated to control the output voltage VX of the cell to voltage VREF as between t2 and t3. The output level VX obtained at the end of the settling, at a time t7, and the sampling of the correction is then deterministic and equal to that obtained at time t3 due to the removal of the $$\sqrt{\frac{kT}{C}}$$

random portion.

At the end of the settling time, at time t7, between times t6 and t8, signal SMP switches, for example, to a low level to turn off sampling transistor CORR, which enables to store the correction VBB to be applied to capacitive element 255. Between times t7 and t8, an analog-to-digital conversion of voltage VX, not illustrated, is then performed, which enables to measure VX in the absence of photogenerated charges and with a correction of the $$\sqrt{\frac{kT}{C}}$$

noise. By difference between the first conversion (between t4 and t5) and the second conversion (between t7 and t8), the correlated double sampling (CDS) function only provides the result of the integration of photogenerated charges, the $$\sqrt{\frac{kT}{c}}$$

random portion having been corrected.

By comparison, during the same switching to the high state of signal READ between the value of VX obtained between t7 and t8, and the value of VX obtained between t4 and t5, that is, after the integration phase, it is possible to measure a more precise quantity of the accumulated charges with no memory storage. The same elements (cell 210, amplifier 295, control voltages, etc.) being used between times t2 to t3, then between times t6 and t7, the involved disparities are the same, so that their effects will exactly compensate for one another by the correlated double sampling operation.

The phase of the operation of the electronic circuit between times t5 and t8 enables to do away with the transistor sizing dispersions between cells (Fixed Pattern Noise) particularly regarding the disparities between the transistors CORR and/or second transistors SF of the different cells 210 of the different columns.

As a summary, before the first digitization, the control loop enables to divide, by the gain of the loop, the sum of the deterministic offset due to the manufacturing differences and of the generated first $$\sqrt{\frac{kT}{c}}$$

random noise. Similarly, before the second digitization, control loop 295 enables to correct the sum of the deterministic offset due to manufacturing differences and of the generated second $$\sqrt{\frac{kT}{c}}$$

random noise.

The difference between the two digitizations corresponds to the signal due to the photogenerated charges.

The correlated double sampling (CDS) enables to calculate the difference between the two digitizations to obtain the photogenerated charges.

Those skilled in the art may however implement a measurement of the photogenerated charges with no correlated double sampling at the cost, however, of a lower accuracy. Indeed, the correlated double sampling enables to correct, in particular, the offset of amplifier 290 and the charge injection during the sampling at VBB.

Figure 4:
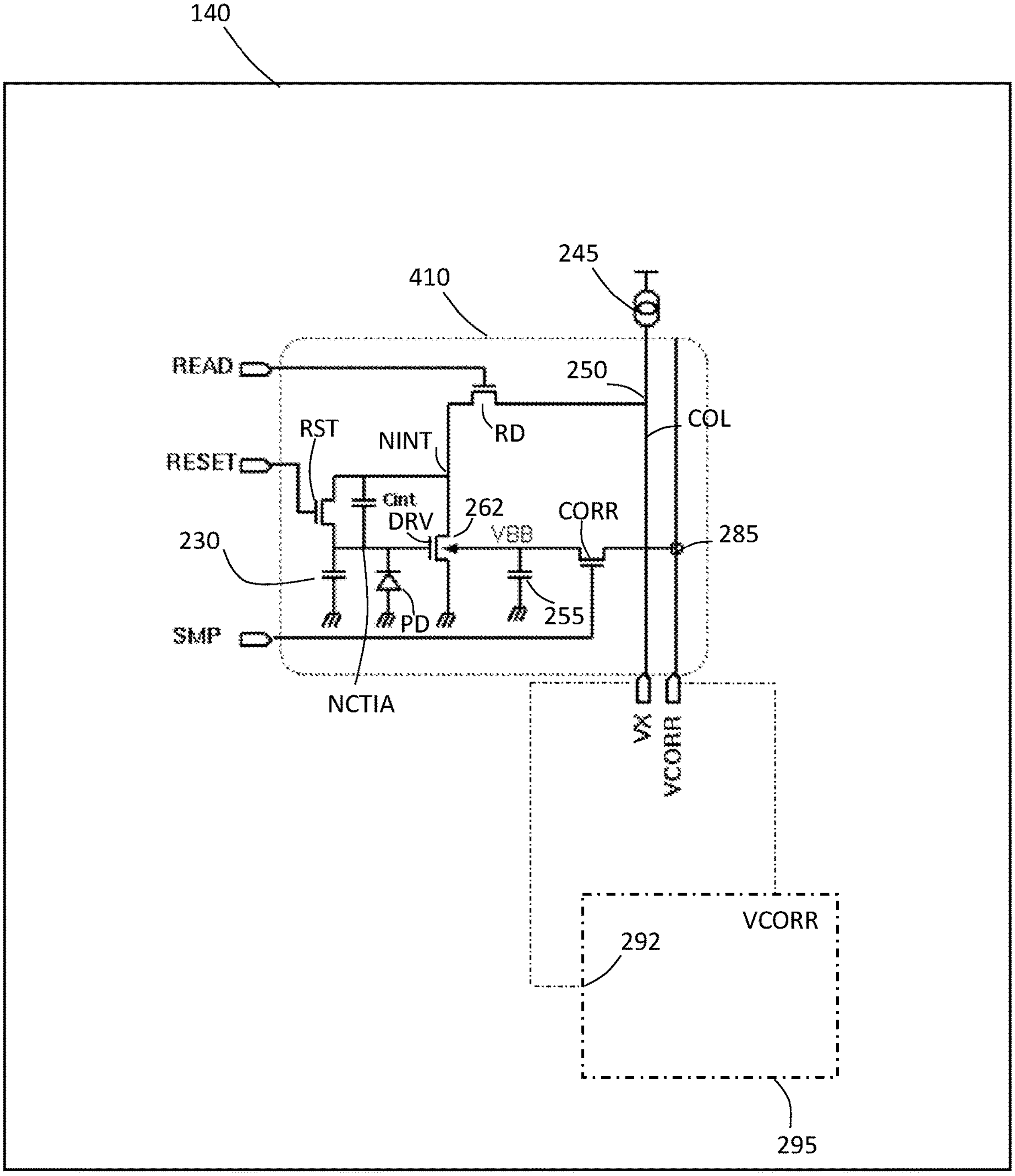
FIG. 4 is a simplified view of an array of image acquisition cells of an electronic circuit according to an embodiment of the present description.

FIG. 4 is a simplified view of an array 140 of image acquisition cells 410 of an electronic circuit according to an embodiment of the present description. In the example of FIG. 4, only one cell 410 is shown for clarity reasons, but a plurality of cells 410 are for example arranged in a column and in rows similarly to x cells 210 of FIG. 2.

The cells 410 of FIG. 4 use elements similar to those of the cells 210 of FIG. 2, except that cells 410 each comprise a pixel of CTIA type and not a transistor of "3T" type.

In the example of FIG. 4, the CTIA pixel of cell 410 comprises a photodiode PD referenced to ground and coupled to an input node NCTIA of the CTIA. The sum of all the capacitances connected to input node NCTIA, that is, the junction capacitance of the photodiode, the capacitances of the connected transistors, and the parasitic capacitances, is represented by reference 230. Photodiode PD is used in reverse and the generated photocurrent integrates in an integration capacitive element Cint coupling node SN to node NCTIA. The cathode of the photodiode is coupled to node NCTIA.

In the example of FIG. 4, the pixel CTIA of cell 410 comprises a first RST transistor configured to couple input node NCTIA to a sense node SN common to transistors RD and DRV. Transistor RST receives, on its gate, a signal RESET with two control states for resetting the voltage at input node NCTIA. When signal RESET is in a first state, transistor RST is on, which resets the charge of Cint. In a second state of signal RESET, transistor RST is off, which allows the integration of the photogenerated charges in Cint.

In the example of FIG. 4, transistor DRV, assembled as a common source device, has its gate connected to input node NCTIA and its drain coupled to integration node NINT.

In the example of FIG. 4, cell 410 comprises a transistor RD series-connected with the drain of transistor DRV at common node NCTIA. The drain of transistor DRV is coupled, by third transistor RD, to column conductor COL connected to a current source 245. Transistor RD is controlled by a row selection signal READ.

When cell 410 is biased, that is, when signal READ is at logic 1 state, the potential of node NCTIA is equal to the gate-source voltage of transistor DRV biased by the current originating from current source 245. When signal RESET is at logic 1 state, the voltage across Cint is 0 V. When signal RESET is at logic 0 state, the photogenerated charges integrate in feedback capacitive element Cint. The signal is thus detected at integration node NINT.

In the example of FIG. 4, and similarly to FIG. 2, the transistor DRV of each cell 410 further comprises a node 262 for controlling a back gate voltage VBB of transistor DRV. Transistor DRV is configured, as for FIG. 2, so that its threshold voltage varies according to this back gate voltage.

In the example of FIG. 4, the circuit comprises at least one first control circuit 295, similar to the control circuit 295 of FIG. 2, and having an input coupled to the output 250 of the cells 410 of a same column and having an output coupled to the node 262 for controlling the back gate voltage of the transistor DRV of the cells 410 of the same column via another column conductor 285. The correction applies to a given cell when the corresponding sampling transistor CORR is on, and the cell row is selected with READ=logic 1 state. The control circuit 295 of FIG. 4 being similar to that of FIG. 2, only input 292 and output VCORR are shown. The control circuit 295 of FIG. 4 is configured to adjust a voltage VBB, which is the voltage VCORR which will be sampled, applied to the node 262 for controlling the back gate voltage of transistor DRV according to a comparison between the voltage VX present at the output 250 of the cell selected with signal READ and reference voltage VREF.

The example of FIG. 4, similarly to the example of FIG. 2, enables to store a correction of the threshold voltage on the back gate of common-source assembled transistor DRV, to correct the offset seen on rail VX. Those skilled in the art will be capable of performing the control of back gate voltage VBB, similarly to that discussed in detail in the example of FIG. 2.

The operation of the example of FIG. 4 is, for example, similar to the example of FIG. 3 except that voltage VX between t2 and t6 increases instead of decreasing during the signal integration.

Various embodiments and variants have been described. Those skilled in the art will understand that certain features of these various embodiments and variants may be combined, and other variants will occur to those skilled in the art.

Finally, the practical implementation of the described embodiments and variants is within the abilities of those skilled in the art based on the functional indications given hereabove.

In particular, in the examples of FIG. 2 or 4, the capacitance of capacitor 255 may be selected to be large, as compared for example with that of sense node SN or of the capacitive element Cint to favor the retention independently from the capacitance of sense node SN for FIG. 2 or of the capacitive element Cint of FIG. 4. In other words, the size of sampling capacitor 255 is independent from the sensitivity of image acquisition cell 210, 410.

In particular, although the discussed embodiments are based on the photogeneration of electrons, those skilled in the art may use their knowledge to modify the discussed circuits in the case where holes are generated at sense node SN.

Besides, although the case of photodiodes has been described in the different embodiments, those skilled in the art may replace them with photodetectors comprising an organic material and/or nanoparticles.

The invention claimed is:

1. An electronic circuit, comprising:

image acquisition cells, wherein each image acquisition cell comprises:

a photodetector coupled to a first node of the image acquisition cell; and an amplifying transistor having a front gate connected to the first node, a conduction node coupled to an output of the image acquisition cell, and a back gate coupled to a node for controlling a back gate voltage;

wherein the amplifying transistor has a threshold voltage that varies according to the back gate voltage of the amplifying transistor; and at least one control circuit configured to adjust a voltage applied as the back gate voltage to the back gate of the amplifying transistor of one of the image acquisition cells according to a difference between a voltage present at the image acquisition cell output and a reference voltage;

wherein each image acquisition cell comprises a sampling capacitor and a sampling transistor, and wherein the back gate of the amplifying transistor is coupled to the sampling capacitor and coupled to an output of the at least one control circuit via the sampling transistor; and wherein the sampling capacitor stores a sampled correction value of the output of the at least one control circuit for controlling the back gate voltage applied to the back gate of the amplifying transistor.

2. The electronic circuit according to claim 1, wherein the amplifying transistor is formed in a technology using a depleted semiconductor on insulator substrate.

3. The electronic circuit according to claim 1, wherein a size of the sampling capacitor is independent from the sensitivity of the image acquisition cell.

4. The electronic circuit according to claim 1, wherein the at least one control circuit comprises a differential amplifier having a first input coupled to said output of the image acquisition cell, and having a second input configured to receive the reference voltage, and wherein an output of the differential amplifier delivers an output voltage that is applied through the sampling transistor to the sampling capacitor.

5. The electronic circuit according to claim 1, wherein the sampling capacitor has a capacitance greater than that of the first node.

6. The electronic circuit according to claim 1, wherein the first node of each image acquisition cell is a sense node and each image acquisition cell comprises:

a readout transistor series-connected with the amplifying transistor; and a reset transistor configured to couple the sense node to a reset voltage rail, the amplifying transistor being assembled as a source-follower device and having said conduction node coupled to the output of the image acquisition cell via the readout transistor.

7. The electronic circuit according to claim 1, wherein each image acquisition cell is a capacitive transimpedance amplifier type cell comprising:

a readout transistor series-connected with the amplifying transistor;

a reset transistor configured to couple an integration node, common to the readout transistor, to the amplifying transistor, and to the reset transistor, to the first node; and an integration capacitive element coupling the integration node and the first node;

the amplifying transistor having said conduction node coupled to the output of the image acquisition cell via the readout transistor.

8. An electronic circuit, comprising:

image acquisition cells, wherein each image acquisition cell comprises:

a photodetector coupled to a first node of the image acquisition cell; and an amplifying transistor having a front gate connected to the first node, a conduction node coupled to an output of the image acquisition cell, and a back gate coupled to a node for controlling a back gate voltage;

wherein the amplifying transistor has a threshold voltage that varies according to the back gate voltage of the amplifying transistor; and at least one control circuit configured to adjust a voltage applied as the back gate voltage to the back gate of the amplifying transistor of one of the image acquisition cells according to a difference between a voltage present at the image acquisition cell output and a reference voltage;

wherein each image acquisition cell is a capacitive transimpedance amplifier type cell comprising:

a readout transistor series-connected with the amplifying transistor;

a reset transistor configured to couple an integration node, common to the readout transistor, to the amplifying transistor, and to the reset transistor, to the first node; and an integration capacitive element coupling the integration node and the first node;

the amplifying transistor having said conduction node coupled to the output of the image acquisition cell via the readout transistor; and wherein each image acquisition cell comprises a sampling capacitor and a sampling transistor, and wherein the back gate voltage applied to the back gate of the amplifying transistor is coupled to the sampling capacitor and coupled to an output of the at least one control circuit via the sampling transistor, and wherein the sampling capacitor has a capacitance greater than that of the integration capacitive element.

9. The electronic circuit according to claim 1, wherein at least some of the image acquisition cells are arranged in at least one cell column, where the outputs of said at least some of the image acquisition cells are interconnected by at least one first column conductor coupled to a current source and to said at least one control circuit configured to sequentially adjust the voltage applied to the back gate of the amplifying transistor as the back gate voltage of each of said at least some of the image acquisition cells in said at least one cell column.

10. The electronic circuit according to claim 1, wherein the amplifying transistor is insulated by trenches.

11. The electronic circuit according to claim 1, wherein the photodetectors comprise an organic material.

12. The electronic circuit according to claim 1, wherein the photodetectors comprise nanoparticles.

13. An electronic circuit, comprising:

image acquisition cells, wherein each image acquisition cell comprises:

a photodetector coupled to a first node; and a source-follower transistor having a front gate coupled to the first node, a conduction node coupled to an output of the image acquisition cell, and a back gate; and a control circuit configured to compare a voltage at the output of the image acquisition cell to a reference voltage to generate a back gate voltage which is applied to the back gate of the source-follower transistor; and wherein each image acquisition cell comprises a sampling capacitor coupled to the back gate and a sampling transistor coupled between the back gate and an output of the control circuit, and wherein the back gate voltage is stored by the sampling capacitor in response to actuation of the sampling transistor.

14. The electronic circuit according to claim 13, wherein the control circuit comprises a differential amplifier having a first input coupled to said output of the image acquisition cell, and having a second input configured to receive the reference voltage, the back gate voltage being generated from a difference between the output of the image acquisition cell and the reference voltage.

15. An electronic circuit, comprising:

image acquisition cells, wherein each image acquisition cell comprises:

a photodetector coupled to a first node; and a common-source transistor having a front gate coupled to the first node, a conduction node coupled to an output of the image acquisition cell, and a back gate; and a control circuit configured to compare a voltage at the output of the image acquisition cell to a reference voltage to generate a back gate voltage which is applied to the back gate of the common-source transistor; and wherein each image acquisition cell comprises a sampling capacitor coupled to the back gate and a sampling transistor coupled between the back gate and an output of the control circuit, and wherein the back gate voltage is stored by the sampling capacitor in response to actuation of the sampling transistor.

16. The electronic circuit according to claim 15, wherein the control circuit comprises a differential amplifier having a first input coupled to said output of the image acquisition cell, and having a second input configured to receive the reference voltage, the back gate voltage being generated from a difference between the output of the image acquisition cell and the reference voltage.

* * * * *